(12) United States Patent
Lee et al.

(10) Patent No.: US 7,432,156 B1
(45) Date of Patent: Oct. 7, 2008

(54) MEMORY DEVICE AND METHODS FOR ITS FABRICATION

(75) Inventors: Chungho Lee, Sunnyvale, CA (US);
Ashot Melik-Martirosian, Sunnyvale, CA (US); Hiroyuki Kinoshita, San Jose, CA (US); Kuo-Tung Chang, Saratoga, CA (US); Amol Joshi, Sunnyvale, CA (US); Meng Ding, Sunnyvale, CA (US)

(73) Assignee: Spansion LLC, Sunnyvale, CA (US)

( * ) Notice: Subject to any disclaimer, the term of this patent is extended or adjusted under 35 U.S.C. 154(b) by 255 days.

(21) Appl. No.: 11/409,361

(22) Filed: Apr. 20, 2006

(51) Int. Cl.
*H01L 21/8247* (2006.01)

(52) U.S. Cl. .............................. 438/260; 257/E21.179

(58) Field of Classification Search ......... 438/257–267; 257/E21.179
See application file for complete search history.

(56) References Cited

U.S. PATENT DOCUMENTS

| 6,215,702 | B1 | 4/2001 | Derhacobian et al. |
| 6,639,271 | B1 | 10/2003 | Zheng et al. |
| 6,861,307 | B2 | 3/2005 | Zheng et al. |
| 6,917,068 | B1 | 7/2005 | Krivokapic |
| 7,189,618 | B2 * | 3/2007 | Lee ............................. 438/260 |
| 2005/0037577 | A1 * | 2/2005 | Kim et al. .................... 438/260 |

* cited by examiner

*Primary Examiner*—Richard A. Booth
(74) *Attorney, Agent, or Firm*—Ingrassia Fisher & Lorenz, P.C.

(57) ABSTRACT

A semiconductor memory device and a method for its fabrication are provided. In accordance with one embodiment of the invention the method comprises the steps of forming a gate insulator and a gate electrode overlying a semiconductor substrate. The gate insulator is etched to form an undercut opening beneath an edge of the gate electrode and the undercut opening is filled with a layered structure comprising a charge trapping layer sandwiched between layers of oxide and nitride. A region of the semiconductor substrate is impurity doped to form a bit line aligned with the gate electrode, and a conductive layer is deposited and patterned to form a word line coupled to the gate electrode.

15 Claims, 4 Drawing Sheets

US 7,432,156 B1

MEMORY DEVICE AND METHODS FOR ITS FABRICATION

TECHNICAL FIELD

The present invention generally relates to semiconductor memory devices and to methods for their fabrication, and more particularly relates to nonvolatile memory devices, especially dual storage node memory devices and to method for their fabrication.

BACKGROUND

Memory storage capacity has been enhanced by fabricating dual storage node nonvolatile semiconductor memory cells that are able to store two bits of data in each memory cell. Such cells store information in a charge storage layer with charge storage locations at opposite sides of a control gate. If the charge storage layer is continuous between the storage locations, there is a potential problem of charge diffusion between the storage locations resulting in problems of data retention and reliability. The charge storage locations can be separated in a dual storage node device by utilizing an undercut structure such as disclosed in U.S. Pat. No. 6,861,307. Such a device, however, results in an undercut feature that is difficult to fill easily and reliably without leaving an air void. Additionally, especially as device dimensions shrink, it is difficult in such a structure to achieve the desired effective oxide thicknesses in the storage locations and in the gate insulator separating the storage locations.

Accordingly, it is desirable to provide a nonvolatile semiconductor memory device having isolation between dual storage nodes. In addition, it is desirable to provide a semiconductor memory device having enhanced data retention. It is also desirable to provide a nonvolatile memory device that is programmable by channel hot electron injection and that can be erased by Fowler-Nordheim tunneling. It is also desirable to provide methods for fabricating an undercut structure nonvolatile memory device having improved data retention. Furthermore, other desirable features and characteristics of the present invention will become apparent from the subsequent detailed description and the appended claims, taken in conjunction with the accompanying drawings and the foregoing technical field and background.

BRIEF SUMMARY

Nonvolatile semiconductor memory devices are provided that includes dual memory nodes and that can be scaled down to small dimensions. In accordance with one embodiment of the invention a memory device comprises first and second layered stacks formed on a semiconductor substrate. Each of the layered stacks comprises spatially sequential layers of oxide, nitride, polycrystalline silicon, nitride, and oxide. A gate insulator is positioned between the first and second layered stacks, and a control gate overlies the layered stacks and the gate insulator.

Methods are provided for fabricating a memory device. In accordance with one embodiment of the invention a method comprises the steps of forming a gate insulator and a gate electrode overlying a semiconductor substrate. The gate insulator is etched to form an undercut opening beneath an edge of the gate electrode and the undercut opening is filled with a layered structure comprising a charge trapping layer sandwiched between layers of oxide and nitride. A region of the semiconductor substrate is impurity doped to form a bit line aligned with the gate electrode, and a conductive layer is deposited and patterned to form a word line coupled to the gate electrode.

BRIEF DESCRIPTION OF THE DRAWINGS

The present invention will hereinafter be described in conjunction with the following drawing figures, wherein like numerals denote like elements, and wherein.

DETAILED DESCRIPTION

The following detailed description is merely exemplary in nature and is not intended to limit the invention or the application and uses of the invention. Furthermore, there is no intention to be bound by any expressed or implied theory presented in the preceding technical field, background, brief summary or the following detailed description.

FIGS. 1-8 illustrate schematically, in cross section, method steps in accordance with various embodiments of the invention for the fabrication of an inventive nonvolatile memory device 20. The figures illustrate the fabrication of only a single memory cell. Those of skill in the art will appreciate that a complete memory device may include a large number of such cells in addition to isolation, such as shallow trench isolation, between devices that need to be electrically isolated, bit lines, word lines, bit line drivers, contacts to the bit lines and word lines, word line drivers, clock circuits, address decoding circuits and the like. Fabrication of such structural and circuit elements can be easily integrated with the methods for fabricating the memory cell structure that will be described herein to fabricate the complete semiconductor memory device. Many of the steps employed in the fabrication of semiconductor devices are well known and so, in the interest of brevity, some of those conventional steps will only be mentioned briefly herein or will be omitted entirely without providing the well known process details.

Figure 1:
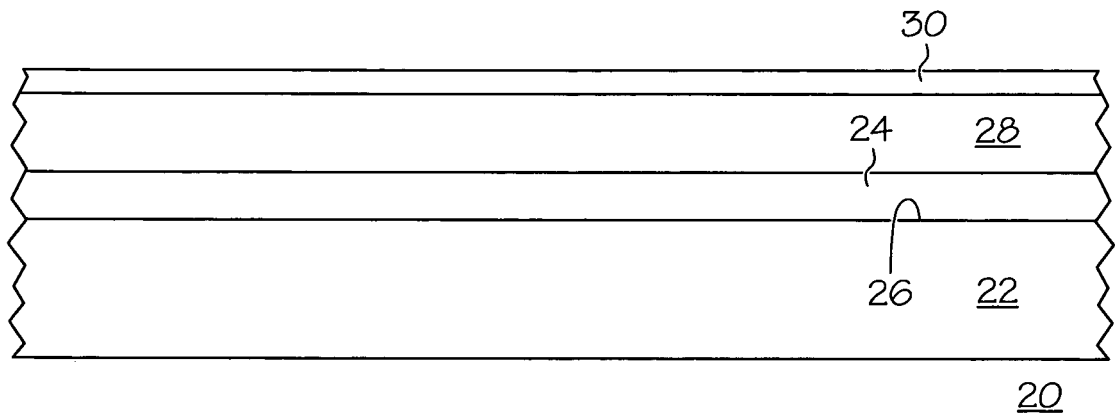
FIGS. 1-8 illustrate schematically, in cross section, method steps for fabricating a semiconductor memory device in accordance with various embodiments of the invention.

As illustrated in FIG. 1, the method in accordance with one embodiment of the invention begins with providing a semiconductor substrate 22. Preferably the semiconductor substrate is a silicon substrate where the term "silicon substrate" will be used to encompass the relatively pure or lightly impurity doped monocrystalline silicon materials typically used in the semiconductor industry as well as silicon admixed with other elements such as germanium, carbon, and the like to form substantially monocrystalline semiconductor material. The silicon substrate can be a bulk silicon wafer as illustrated, or can be a thin layer of silicon on an insulator (silicon on insulator or SOI) that, in turn, is supported on a semiconductor substrate. A layer of gate insulator 24 is formed at surface 26 of the silicon substrate, and a layer of gate electrode forming material 28 is deposited over the layer of gate insulator. A layer 30 of hard mask material is deposited over the layer of gate electrode forming material. The gate insulator is preferably silicon dioxide having a physical thickness of about 15-40 nanometers (nm), and most preferably a physical thickness of about 20 nm. The layer of gate electrode forming material is preferably polycrystalline silicon having a thickness of about 5-15 nm. The gate electrode forming material will hereinafter be referred to, for ease of reference but without limitation, as polycrystalline silicon. The polycrystalline silicon can be deposited, for example, by the reduction of silane ($SiH_4$) in a chemical vapor deposition (CVD) reaction. If the layer of gate insulator is silicon dioxide, the layer can be grown by the thermal oxidation of the silicon substrate. The gate insulator, whether silicon dioxide or other dielectric material, can also be deposited, for example by CVD, low pressure chemical vapor deposition (LPCVD) or plasma enhanced chemical vapor deposition (PECVD). A gate insulator deposition step may be followed by a thermal anneal to densify the layer. The gate insulator material is characterized by a dielectric constant, K. It is instructive, for reasons to be explained below, to define the "effective oxide thickness" (EOT) of dielectric layers as the physical thickness of a dielectric layer divided by its dielectric constant and multiplied by the dielectric constant for silicon dioxide. Effective oxide thickness thus serves to normalize the insulator thickness based on dielectric constant relative to the dielectric constant of silicon dioxide. The layer of hard mask material can be, for example, a layer of silicon oxide having a thickness of about 30 nm deposited by CVD from a tetraethylorthosilicate (TEOS) source or a thin layer of silicon oxide and a thicker overlying layer of silicon nitride. The layer of silicon nitride can be deposited, for example, by LPCVD from the reaction of dichlorosilane and ammonia.

Figure 2:
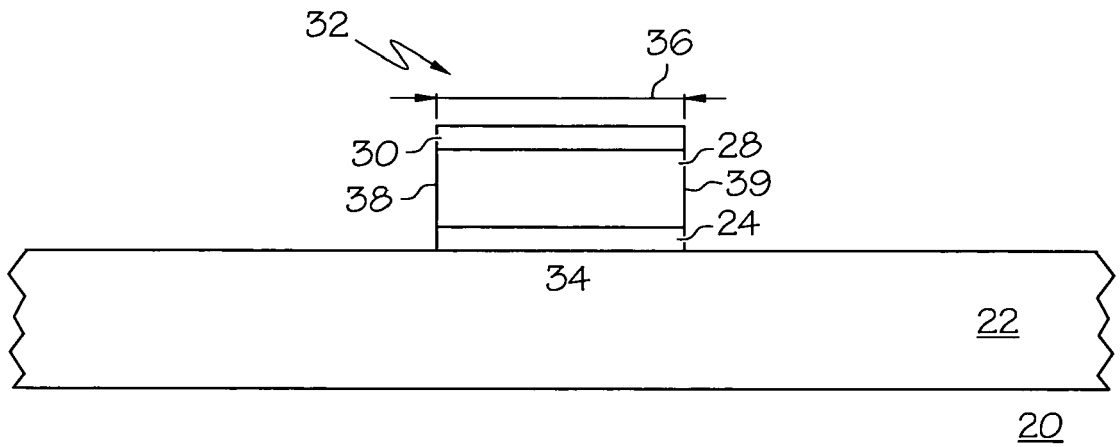

The method continues, as illustrated in FIG. 2, by the patterning and etching of the layers of hard mask material, polycrystalline silicon, and gate insulator to form a gate electrode 32. The patterned gate electrode overlies a channel 34 at the near surface of the semiconductor substrate. In accordance with one embodiment of the invention, the gate electrode can be patterned to have a length indicated by double headed arrow 36 of about 50-160 nm between gate edges 38 and 39.

Figure 3:
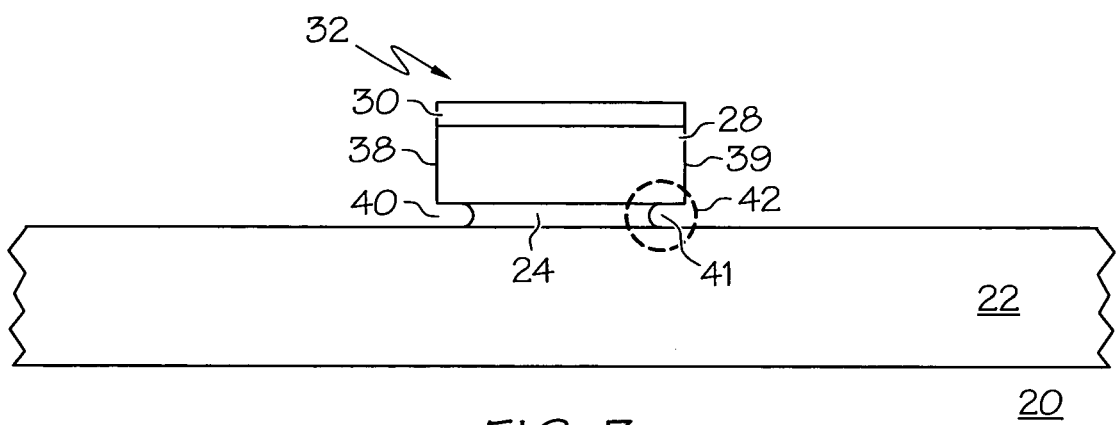

In accordance with one embodiment of the invention the method continues as illustrated in FIG. 3 by the undercut etching of gate insulator layer 24 to form undercut regions 40 and 41 at edges 38 and 39, respectively, of gate electrode 32. The gate insulator can be isotropically etched, for example, by vapor phase HF etching or by etching in a solution of dilute hydrofluoric acid. Preferably, for a 100 nm gate length, the undercut regions extend under the gate electrode for a distance of about 25 nm. The following method steps are illustrated in FIGS. 4 and 5 which show an enlarged view of the region indicated by the dashed circle 42 in FIG. 3.

Figure 4:
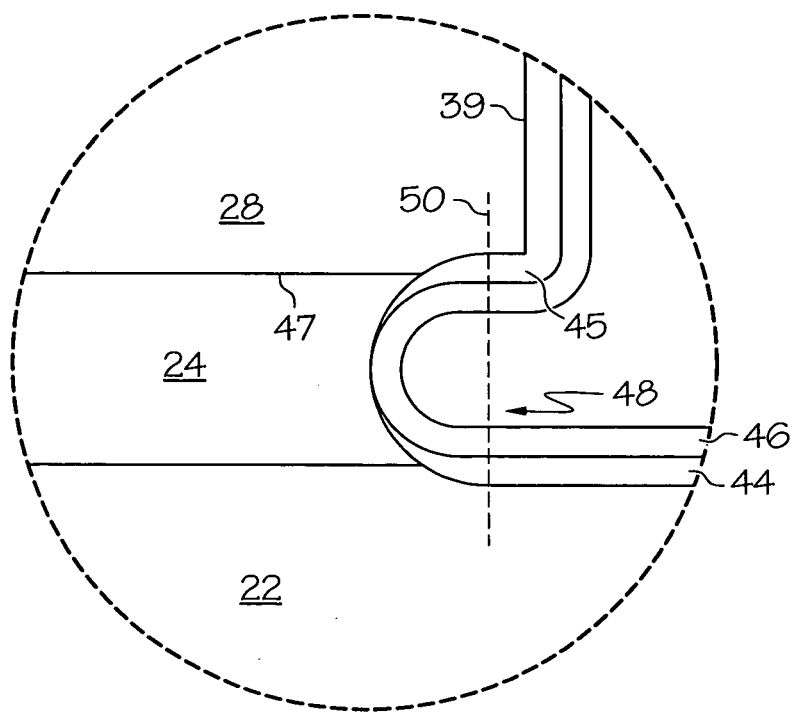

After etching undercut regions 40 and 41, a tunnel dielectric layer 44 is formed on the surface of semiconductor substrate 22 and simultaneously a dielectric layer 45 is formed on the underside 47 and exposed side surfaces of gate electrode 32 as illustrated in FIG. 4. Preferably dielectric layers 44 and 45 are layers of silicon oxide having a thickness of about 4-7 nm and most preferably, as illustrated, are layers of silicon dioxide having a thickness of about 5 nm formed by the thermal oxidation of the surface of the silicon substrate and the surface of the polycrystalline silicon gate electrode. Because silicon is consumed in the thermal oxidation process, the thermally grown dielectric layers are recessed into the surface of both the substrate and the gate electrode. Dielectric layers 44 and 45 can also be deposited by LPCVD or PECVD. An additional dielectric layer 46 having a different dielectric constant than the dielectric constant of dielectric layers 44 and 45 is deposited on dielectric layers 44 and 45. Dielectric layer 46 is preferably not an oxide layer and instead is a layer of silicon nitride or silicon rich silicon nitride that can be deposited, for example, by LPCVD from the reaction of dichlorosilane and ammonia. Stoichiometric silicon nitride is $Si_xN_y$ for which x=3 and n=4; silicon rich silicon nitride is a silicon/nitrogen material for which x/y is greater than ¾. Silicon rich nitride is more conductive and tends to have shallower trap energy levels and higher trap density than stoichiometric silicon nitride. Dielectric layer 46 can be deposited to a thickness of about 2-6 nm, and preferably to a thickness of about 3 nm. The thicknesses given for the thicknesses of dielectric layers 44, 45, and 46 are those thicknesses that are preferred when gate insulator 24 is silicon dioxide having a physical thickness of about 20 nm. After deposition of dielectric layer 46, a void 48 remains in the undercut region. A cross section through the under cut region at this point in the fabrication, such as along the line 50, with preferred dielectric layers, would show a void region sandwiched between layers of oxide and nitride.

Figure 5:
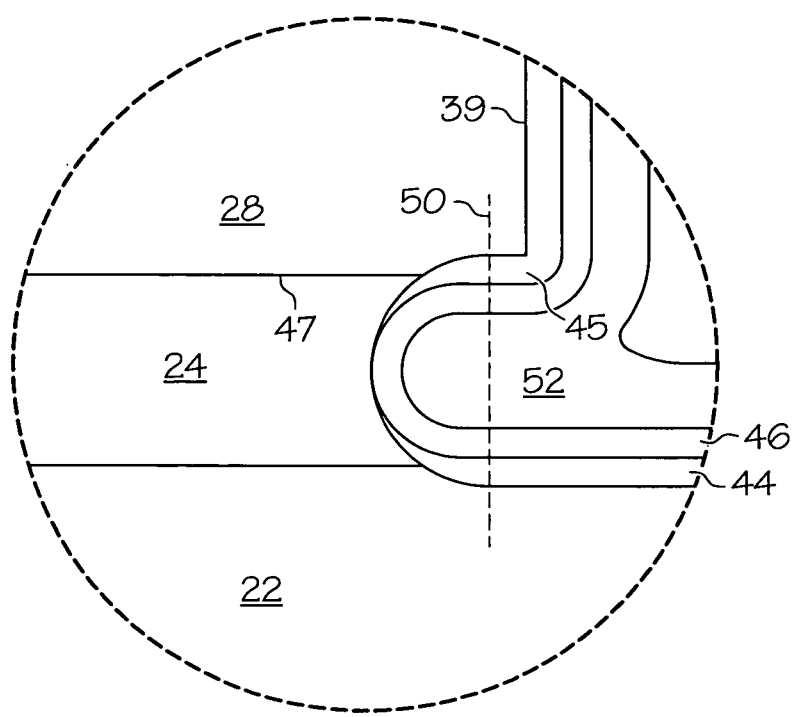

As illustrate in FIG. 5, in accordance with an embodiment of the invention, void region 48 is filled with a charge storage layer 52. Preferably the charge storage layer is either polycrystalline or amorphous silicon, and most preferably is polycrystalline silicon impurity doped with an N or P-type conductivity determining element. The N or P-type polycrystalline silicon forms a conductive charge storage layer. Other materials can be used for the charge storage layer, including other conductive materials. The charge storage layer can be deposited, for example, by LPVCD. To insure that the void is completely filled, it may be advantageous to use multiple partial deposition/partial etch steps. Viewed along the same cross section at line 50, the undercut region is now completely filled with a charge storage layer sandwiched between dielectric layers. The layer of charge storage material sandwiched between dielectric layers, in a preferred embodiment comprising layers of oxide and nitride on either side of a layer of silicon, forms one charge storage node of a dual node nonvolatile memory cell. The composition and thickness of the dielectric layers and the charge storage layer are selected, in accordance with an embodiment of the invention, so that the composite effective oxide thickness of the layers filling undercut regions 40 and 41 is less than the effective oxide thickness (EOT) of gate insulator layer 24. The composite EOT of the layers filling the undercut regions is the sum of the EOT of each of the layers individually. As stated above, the effective oxide thickness of a layer is the physical thickness of that layer divided by the dielectric constant of the layer material.

Figure 6:
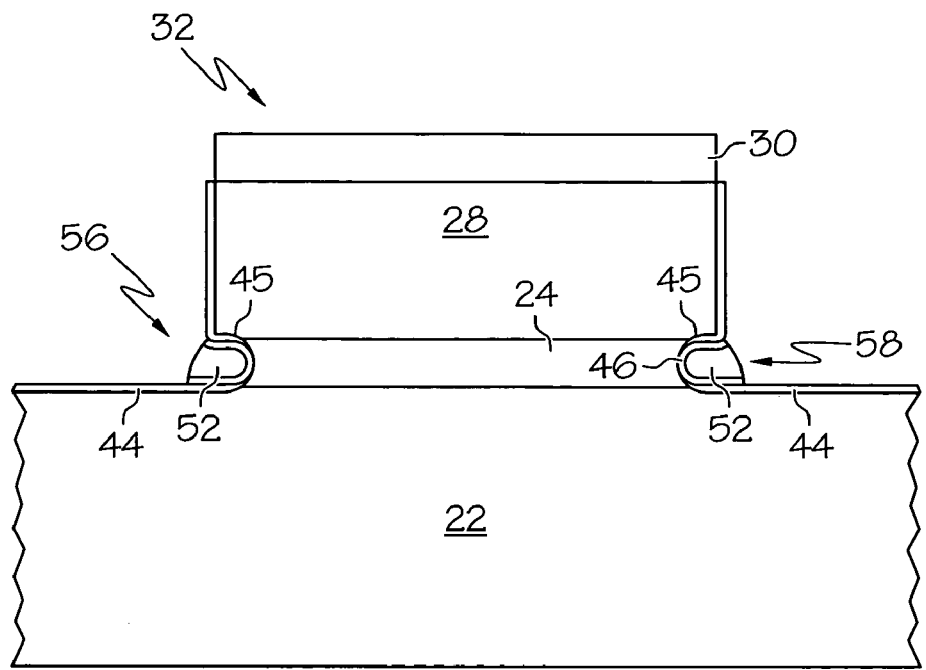

Following the filling of void 48 with charge storage layer 52, the charge storage layer and dielectric layer 46 are removed from the top and sidewalls of gate electrode 32. If the charge storage layer is silicon, the silicon can be converted to a silicon oxide by thermal oxidation and the silicon oxide can be removed by wet etching with a dilute HF solution. This is a more controllable removal method than direct etching of the silicon layer. If dielectric layer 46 is silicon nitride or silicon rich silicon nitride, that layer can be removed by etching in phosphoric acid ($H_3PO_4$). The partially fabricated memory storage cell appears as illustrated in FIG. 6 after such conversion/removal. As illustrated in this figure, the memory storage cell includes a gate electrode 32 that overlies a central gate insulator 24 and two charge storage nodes 56 and 58 that are positioned at opposite sides of the central gate insulator.

Figure 7:
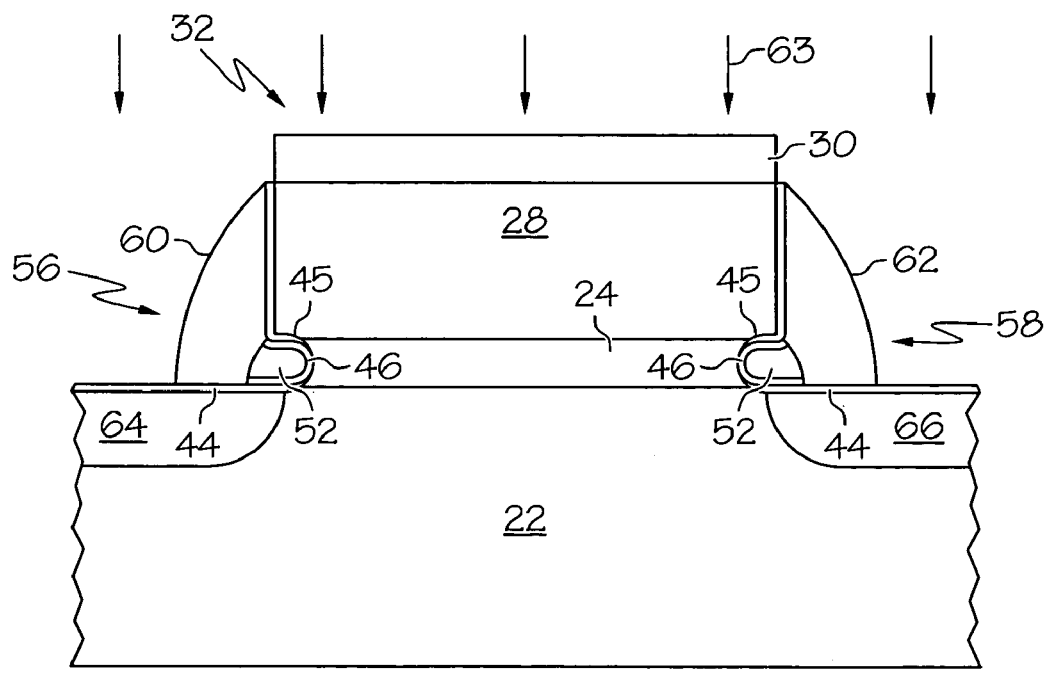

The method continues, in accordance with an embodiment of the invention, with the deposition of a layer of spacer forming material (not illustrated) such as a layer of silicon oxide or silicon nitride. The layer of spacer forming material is anisotropically etched, for example by reactive ion etching, to form sidewall spacers 60 and 62 at the sidewalls of gate electrode 32 as illustrated in FIG. 7. The sidewall spacers can be used, together with hard mask 30, as an ion implantation mask while conductivity determining ions are implanted into the surface of semiconductor substrate 22 as indicated by arrows 63 to form bit lines 64 and 66 spaced apart from but self aligned with gate electrode 32.

Figure 8:
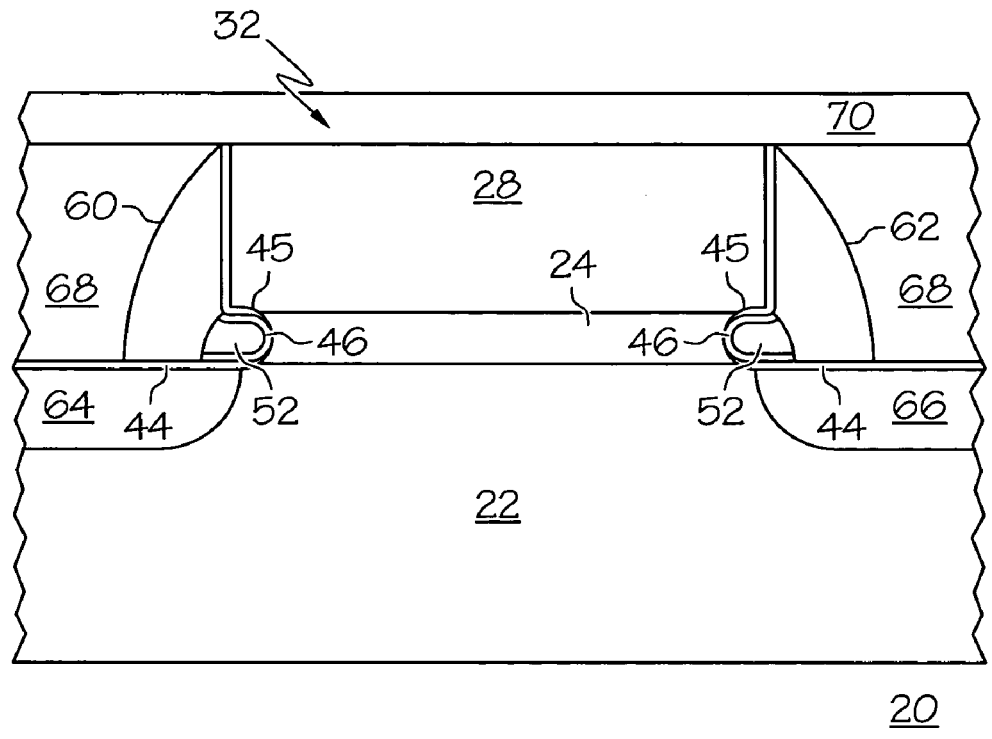

As illustrated in FIG. 8, a layer of insulating material 68 is deposited over the gate electrode, sidewall spacers, and implanted bit lines. The insulating layer is planarized, for example by chemical mechanical planarization (CMP) or can be selectively etched, for example by a photolithography and etch process. The remainder of hard mask 30 can be removed by wet etching to expose the top portion of gate electrode 32. A conductive material 70, such as doped polycrystalline silicon is deposited on the insulating layer and is photolithographically patterned and etched to form a word line contacting gate electrode 32.

Figure 9:
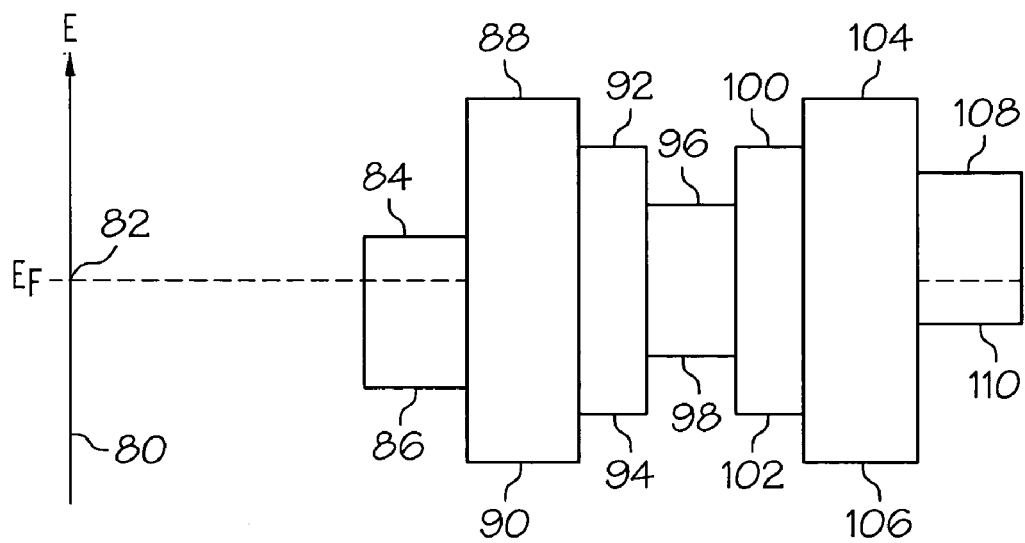
FIG. 9 is an energy band diagram for a charge storage node in accordance with a preferred embodiment of the invention.

FIG. 9 is an energy band diagram, in the flat band condition, for the polycrystalline silicon (gate electrode)/oxide/nitride/polycrystalline silicon (charge storage layer)/nitride/oxide/silicon (substrate) for a charge storage node in accordance with a preferred embodiment of the invention. Vertical axis 80 is an energy scale (in electron volts) with the Fermi level, $E_F$, indicated at 82. The conduction and valence bands in the polycrystalline silicon gate electrode (assumed to be doped heavily N-type) are indicated at 84 and 86, respectively, in the top oxide at 88 and 90, respectively, in the top nitride (whether silicon nitride or silicon rich silicon nitride) at 92 and 94, respectively, in the charge storage layer (assumed to be N-type polycrystalline silicon) at 96 and 98, respectively, in the bottom nitride layer at 100 and 102, respectively, in the tunnel oxide at 104 and 106, respectively, and in the substrate silicon (assumed to be P-type silicon) at 108 and 110, respectively. Data retention in this charge storage node structure is better than in prior art structures because for charge stored on the polycrystalline silicon charge storage layer the nitride and oxide layers present a greater barrier to carrier removal, into either the control gate or the substrate, than does just the tunnel oxide layer of prior structures. Additionally, with this structure the two charge storage nodes of the memory cell are separated by the gate insulator, so there is no conductive path for charge diffusion between nodes even as the device is scaled to smaller dimensions. Because the gate insulator and the dielectric stack in the undercut region are formed independently, the stack can be formed with an EOT that is less than the EOT of the gate insulator. The inventive memory cell can be programmed by channel hot carrier injection, but the thinner EOT in the charge storage node allows Fowler-Nordheim erasing.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:

1. A method for fabricating a memory device in and on a silicon substrate, the method comprising the steps of:
    forming a gate oxide layer on a surface of the silicon substrate;
    depositing and patterning a layer of polycrystalline silicon to form a polycrystalline silicon gate electrode overlying the gate oxide layer, the polycrystalline silicon gate electrode having first and second opposing edges;
    etching the gate oxide layer to form first and second undercut regions of the gate oxide layer at the first and second opposing edges, respectively, of the polycrystalline silicon gate electrode;
    in each of the first and second undercut regions:
        thermally oxidizing the silicon substrate and the polycrystalline silicon gate electrode to form a first silicon oxide layer at the surface of the silicon substrate and a second silicon oxide layer on the polycrystalline silicon gate electrode;
        depositing a layer of nitride on the first silicon oxide layer and on the second silicon oxide layer, leaving a void between the layer of nitride on the first silicon oxide layer and the layer of nitride on the second silicon oxide layer; and
        depositing a layer comprising polycrystalline silicon to fill the void;
    implanting conductivity determining ions into the silicon substrate to form first and second bit lines in alignment with the first and second opposing edges, respectively; and
    depositing and patterning a layer of conductive material to form a word line electrically coupled to the polycrystalline silicon gate electrode.

2. The method of claim 1 wherein the step of implanting comprises the steps of:
    forming sidewall spacers on the polycrystalline silicon gate electrode; and
    implanting conductivity determining ions using the sidewall spacers as an ion implantation mask to form the bit lines.

3. The method of claim 1 wherein the step of depositing a layer of nitride comprises the step of depositing a layer of silicon nitride.

4. The method of claim 1 wherein the step of depositing a layer of nitride comprises the step of depositing a layer of silicon rich silicon nitride.

5. The method of claim 1 wherein the step of depositing a layer comprising polycrystalline silicon comprises the step of depositing a layer of impurity doped polycrystalline silicon.

6. The method of claim 1 wherein the step of forming a gate oxide layer comprises the step of forming a silicon dioxide layer having a first effective oxide thickness and wherein the steps of thermally oxidizing, depositing a layer of nitride, and depositing a layer comprising polycrystalline silicon comprise forming a layered structure having a composite effective oxide thickness less than the first effective oxide thickness.

7. A method for fabricating a memory device in and on a semiconductor substrate, the method comprising the steps of:
    forming a gate insulator and a gate electrode overlying the semiconductor substrate;
    etching the gate insulator to form an undercut opening beneath an edge of the gate electrode;
    filling the undercut opening with a layered structure comprising a charge trapping layer sandwiched between layers of oxide and nitride;
    impurity doping a region of the semiconductor substrate to form a bit line aligned with the gate electrode; and
    depositing and patterning a conductive layer to form a word line coupled to the gate electrode.

8. The method of claim 7 wherein the step of filling the undercut opening comprises the steps of:
    forming a first oxide layer on the semiconductor substrate and a second oxide layer on the gate electrode;
    forming a non-oxide dielectric layer on the first oxide layer and on the second oxide layer; and depositing the charge trapping layer on the non-oxide dielectric layer.

9. The method of claim 8 wherein the step of forming a non-oxide layer comprises the step of forming a layer comprising a material selected from the group consisting of silicon nitride and silicon rich silicon nitride.

10. The method of claim 7 wherein the step of impurity doping comprises the step of implanting conductivity determining ions into the semiconductor substrate, the method further comprising the step of forming sidewall spacers on the gate electrode for use as ion implantation masks.

11. A method for fabricating a memory device in and on a semiconductor substrate, the method comprising the steps of:
   forming a gate insulator overlying the semiconductor substrate, the gate insulator characterized by a first effective oxide thickness;
   depositing and patterning a gate electrode material overlying the gate insulator to form a gate electrode;
   etching the gate insulator to form an undercut opening beneath an edge of the gate electrode and exposing an underside portion of the gate electrode; and
   filling the undercut opening with a layered structure comprising a charge trapping layer sandwiched between dielectric layers, the layered structure having a second effective oxide thickness less than the first effective oxide thickness.

12. The method of claim 11 wherein the step of filling comprises the steps of:
   forming a layer of first dielectric material on the semiconductor substrate and on the underside portion of the gate electrode;
   depositing a layer of second dielectric material on the layer of first dielectric material; and
   depositing the charge trapping layer on the layer of second dielectric material.

13. The method of claim 12 wherein the semiconductor substrate comprises a silicon substrate, the gate electrode comprises polycrystalline silicon, and wherein the step of forming a layer of first dielectric material comprises the step of thermally oxidizing the silicon substrate and the polycrystalline silicon to form silicon dioxide layers.

14. The method of claim 12 wherein the step of depositing a layer of second dielectric material comprises the step of depositing a layer of material selected from the group consisting of silicon nitride and silicon rich silicon nitride.

15. The method of claim 14 wherein the step of depositing the charge trapping layer comprises the step of depositing a layer of silicon to fill a void left by the step of depositing a layer of material.

* * * * *